US010600651B2

(12) United States Patent
Tsuji et al.

(10) Patent No.: US 10,600,651 B2
(45) Date of Patent: Mar. 24, 2020

(54) METHOD FOR MANUFACTURING EPITAXIAL SILICON WAFER AND VAPOR PHASE GROWTH DEVICE

(71) Applicant: SUMCO CORPORATION, Tokyo (JP)

(72) Inventors: Masayuki Tsuji, Tokyo (JP); Akihiko Shimizu, Tokyo (JP); Tomokazu Nishimura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 91 days.

(21) Appl. No.: 15/531,579

(22) PCT Filed: Dec. 7, 2015

(86) PCT No.: PCT/JP2015/084290
§ 371 (c)(1),
(2) Date: May 30, 2017

(87) PCT Pub. No.: WO2016/093195
PCT Pub. Date: Jun. 16, 2016

(65) Prior Publication Data
US 2017/0338117 A1  Nov. 23, 2017

(30) Foreign Application Priority Data
Dec. 8, 2014 (JP) .................................. 2014-248075

(51) Int. Cl.
*C30B 25/02* (2006.01)
*H01L 21/20* (2006.01)
(Continued)

(52) U.S. Cl.
CPC .......... *H01L 21/20* (2013.01); *C23C 16/4401* (2013.01); *C23C 16/46* (2013.01);
(Continued)

(58) Field of Classification Search
CPC ................................ C30B 25/02; C30B 25/04
See application file for complete search history.

(56) References Cited

U.S. PATENT DOCUMENTS

2008/0124943 A1* 5/2008 Yuasa ................. H01L 21/0223
438/773
2012/0031650 A1* 2/2012 Hatanaka ................ C23C 16/30
174/251

FOREIGN PATENT DOCUMENTS

CN 1055258 A 10/1991
CN 101834119 A 9/2010
(Continued)

OTHER PUBLICATIONS

International Search Report, along with English language translation thereof, issued in PCT/JP2015/084290 dated Mar. 8, 2016.
(Continued)

*Primary Examiner* — Robert M Kunemund
(74) *Attorney, Agent, or Firm* — Greenblum & Bernstein, P.L.C.

(57) ABSTRACT

A vapor deposition apparatus includes an exhaust regulator provided in an exhaust pipe to regulate exhaust of the reaction chamber and including: a hollow frustum upstream baffle having a larger first opening near a reaction chamber than a second opening near an exhaust device; and a hollow frustum downstream baffle provided near the exhaust device with respect to the upstream baffle and having a larger third opening near the reaction chamber than a fourth opening near the exhaust device. The upstream baffle and downstream baffle are designed so that B/A and C/A are 0.33 or less, at least one of B/A and C/A is 0.26 or less, and (B+C)/A is 0.59 or less, where an inner diameter of the exhaust pipe and diameters of the first and third openings are A, a diameter of the second opening is B and a diameter of the fourth opening is C.

3 Claims, 6 Drawing Sheets

(51) Int. Cl.
  *H01L 21/02* (2006.01)
  *H01L 21/67* (2006.01)
  *C30B 35/00* (2006.01)
  *C23C 16/44* (2006.01)
  *C23C 16/46* (2006.01)
  *C30B 29/06* (2006.01)
  *H01L 21/322* (2006.01)

(52) U.S. Cl.
  CPC .............. *C30B 25/02* (2013.01); *C30B 29/06* (2013.01); *C30B 35/00* (2013.01); *H01L 21/0243* (2013.01); *H01L 21/0262* (2013.01); *H01L 21/02381* (2013.01); *H01L 21/3221* (2013.01); *H01L 21/67017* (2013.01); *H01L 21/6719* (2013.01); *H01L 21/02532* (2013.01)

(56) References Cited

FOREIGN PATENT DOCUMENTS

| | | |
|---|---|---|
| CN | 102290372 A | 12/2011 |
| CN | 102634773 A | 8/2012 |
| CN | 103534791 A | 1/2014 |
| JP | H07-176586 A | 7/1995 |
| JP | 8-125185 | 5/1996 |
| JP | 2009-272367 A | 11/2009 |
| JP | 2012-235074 | 11/2012 |
| JP | 2013-232455 | 11/2013 |

OTHER PUBLICATIONS

Written Opinion of the International Searching Authority, along with English-language translation thereof, issued in PCT/JP2015/084290 dated Mar. 8, 2016.

International Preliminary Report on Patentability issued in PCT/JP2015/084290 dated Jun. 13, 2017.

Decision to Grant a Patent issued in Japanese Patent Application No. 2014-248075, dated Jul. 3, 2018, along with an English translation thereof.

Office Action in CN Patent App. No. 201580066944.1 dated Nov. 28, 2019 (English translation).

* cited by examiner

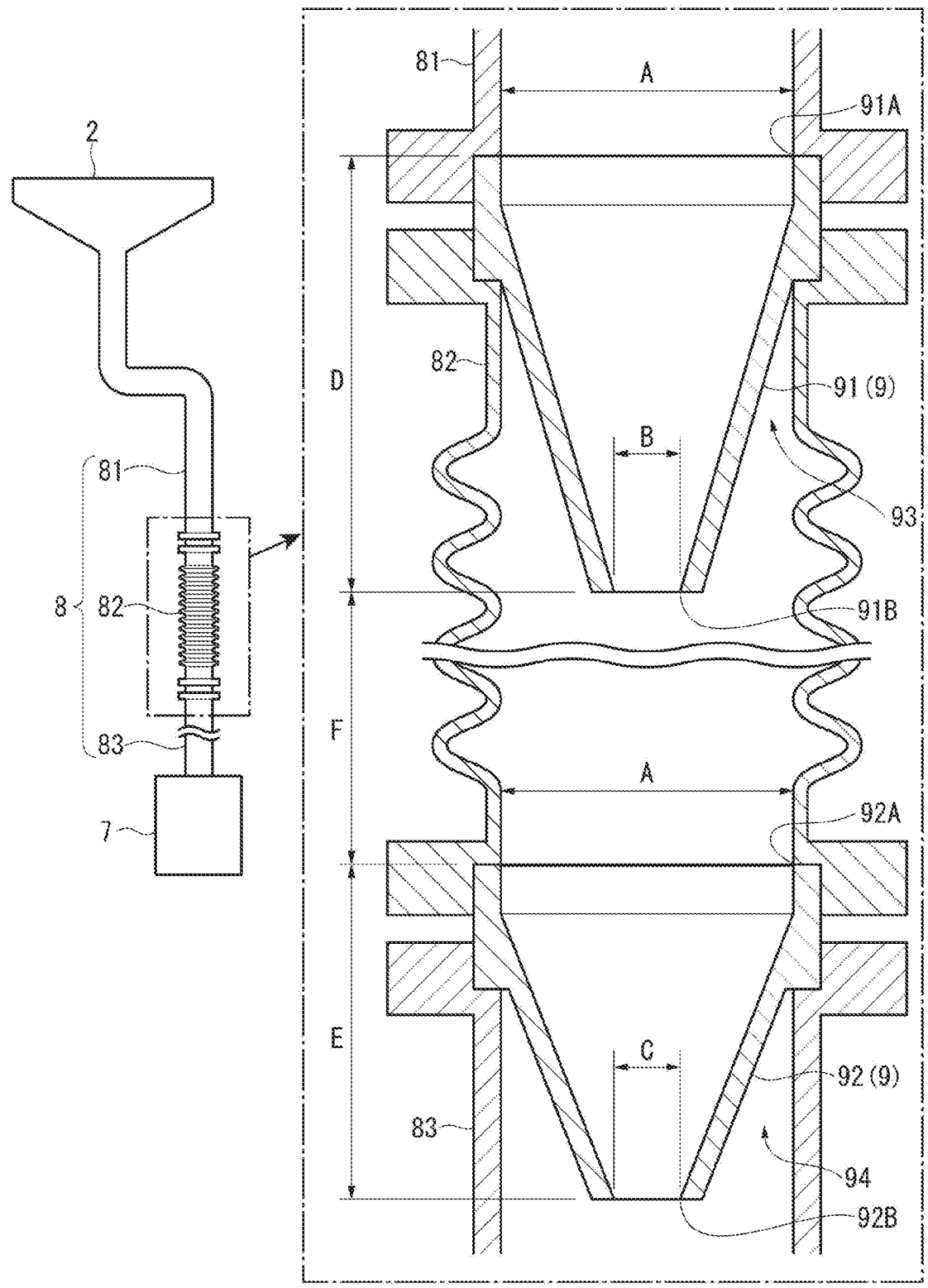

FIG. 3

| | EXHAUST PIPE INNER DIAMETER A | UPSTREAM BAFFLE INNER DIAMETER B (FIRST OPENING: UPSTREAM SIDE) | DOWNSTREAM BAFFLE INNER DIAMETER C (THIRD OPENING: UPSTREAM SIDE) | UPSTREAM BAFFLE HEIGHT D | DOWNSTREAM BAFFLE HEIGHT E | PRESENCE OF OVERSHOOT | LPD (number/wafer) | QUALITY LPD < 0.1:OK LPD ≥ 0.1:NG |
|---|---|---|---|---|---|---|---|---|
| EXPERIMENT 1 | 31 mm | 12 mm | 12 mm | 45 mm | 25 mm | NONE | 0.12 | NG |
| EXPERIMENT 2 | | 12 mm | 10 mm | 45 mm | 25 mm | NONE | 0.14 | NG |
| EXPERIMENT 3 | | 12 mm | 8 mm | 45 mm | 25 mm | NONE | 0.11 | NG |
| EXPERIMENT 4 | | 10 mm | 12 mm | 45 mm | 25 mm | NONE | 0.12 | NG |
| EXPERIMENT 5 | | 10 mm | 10 mm | 45 mm | 25 mm | NONE | 0.13 | NG |
| EXPERIMENT 6 | | 10 mm | 8 mm | 45 mm | 25 mm | PRESENT | 0.07 | OK |
| EXPERIMENT 7 | | 8 mm | 12 mm | 45 mm | 25 mm | NONE | 0.13 | NG |
| EXPERIMENT 8 | | 8 mm | 10 mm | 45 mm | 25 mm | PRESENT | 0.08 | OK |
| EXPERIMENT 9 | | 8 mm | 8 mm | 45 mm | 25 mm | PRESENT | 0.05 | OK |
| EXPERIMENT 10 | | 6 mm | 6 mm | 45 mm | 25 mm | PRESENT | 0.06 | OK |
| EXPERIMENT 11 | | 6 mm | NO DOWNSTREAM BAFFLE | 45 mm | NO DOWNSTREAM BAFFLE | NONE | 0.15 | NG |
| EXPERIMENT 12 | | NO UPSTREAM BAFFLE | 6 mm | NO UPSTREAM BAFFLE | 25 mm | NONE | 0.17 | NG |
| EXPERIMENT 13 | | 12 mm | 12 mm | 69 mm | 37 mm | NONE | 0.11 | NG |
| EXPERIMENT 14 | | 12 mm | 10 mm | 69 mm | 37 mm | NONE | 0.12 | NG |
| EXPERIMENT 15 | | 12 mm | 8 mm | 69 mm | 37 mm | NONE | 0.10 | NG |
| EXPERIMENT 16 | | 10 mm | 12 mm | 69 mm | 37 mm | NONE | 0.10 | NG |
| EXPERIMENT 17 | | 10 mm | 10 mm | 69 mm | 37 mm | NONE | 0.11 | NG |
| EXPERIMENT 18 | | 10 mm | 8 mm | 69 mm | 37 mm | PRESENT | 0.06 | OK |
| EXPERIMENT 19 | | 8 mm | 12 mm | 69 mm | 37 mm | NONE | 0.12 | NG |
| EXPERIMENT 20 | | 8 mm | 10 mm | 69 mm | 37 mm | PRESENT | 0.07 | OK |
| EXPERIMENT 21 | | 8 mm | 8 mm | 69 mm | 37 mm | PRESENT | 0.07 | OK |
| EXPERIMENT 22 | | 6 mm | 6 mm | 69 mm | 37 mm | PRESENT | 0.07 | OK |
| EXPERIMENT 23 | | 6 mm | NO DOWNSTREAM BAFFLE | 69 mm | NO DOWNSTREAM BAFFLE | NONE | 0.16 | NG |
| EXPERIMENT 24 | | NO UPSTREAM BAFFLE | 6 mm | NO UPSTREAM BAFFLE | 37 mm | NONE | 0.16 | NG |

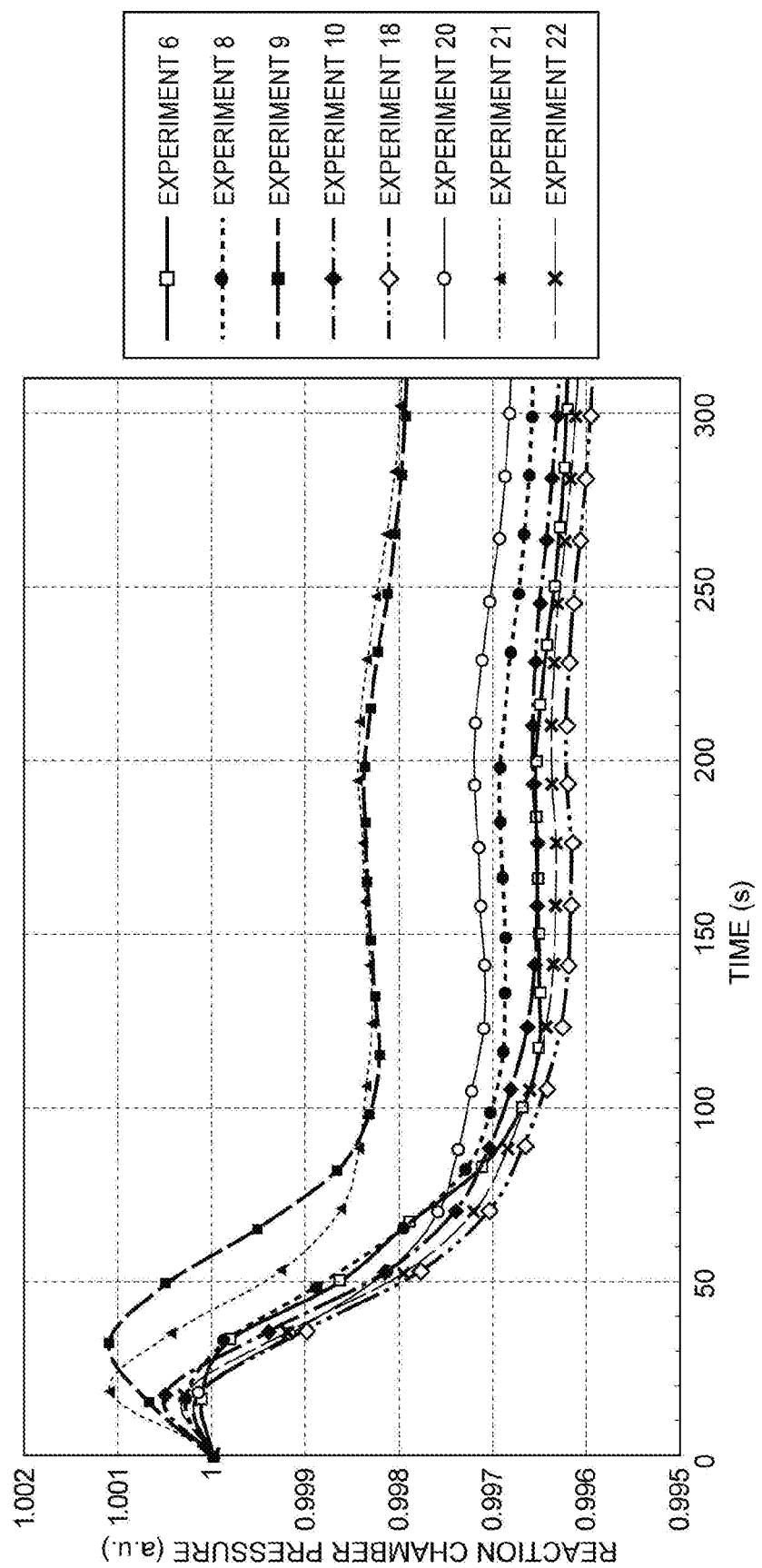

METHOD FOR MANUFACTURING EPITAXIAL SILICON WAFER AND VAPOR PHASE GROWTH DEVICE

TECHNICAL FIELD

The present invention relates to a manufacturing method of an epitaxial silicon wafer and a vapor deposition apparatus.

BACKGROUND ART

A vapor deposition apparatus for manufacturing an epitaxial silicon wafer has been known (see, for instance, Patent Literature 1).

The apparatus disclosed in Patent Literature 1 includes a wafer-transfer chamber in an atmosphere of nitrogen gas, a reaction chamber in an atmosphere of hydrogen gas and a partition-moving mechanism therebetween, where the partition-moving mechanism is opened to introduce the nitrogen gas present in the wafer-transfer chamber into the reaction chamber while the pressure in the wafer-transfer chamber is set higher than the pressure in the reaction chamber. Then, after transferring a silicon wafer received in the wafer-transfer chamber into the reaction chamber, a silicon epitaxial film is formed on the silicon wafer while the partition-moving mechanism is closed and the supply of the nitrogen gas into the reaction chamber is stopped.

CITATION LIST

Patent Literature(s)

Patent Literature 1 JP 2013-232455 A

SUMMARY OF THE INVENTION

Problem(s) to be Solved by the Invention

It should be noted that the apparatus as disclosed in Patent Literature 1 is provided with an exhaust device for exhausting the reaction chamber through an exhaust pipe. A silicon product in a form of a deposit of an epitaxial film material is sometimes present inside the exhaust pipe.

When the partition-moving mechanism is opened in order to transfer the silicon wafer received in the wafer-transfer chamber into the reaction chamber while the product is present inside the exhaust pipe and the pressure in the wafer-transfer chamber is set higher than the pressure in the reaction chamber, the pressure in the wafer-transfer chamber may sometimes become lower than the pressure in the reaction chamber because the nitrogen gas in the wafer-transfer chamber flows into the reaction chamber. When the pressure in the wafer-transfer chamber becomes lower than the pressure in the reaction chamber, a gas flow for compensating the pressure in the wafer-transfer chamber may be generated in the exhaust pipe and the product in the exhaust pipe may flow into the reaction chamber, even if the exhaust device exhausts the reaction chamber.

The product flowed into the reaction chamber may be adhered on the silicon wafer to cause LPDs (Light Point Defect).

An object of the invention is to provide a manufacturing method of an epitaxial silicon wafer capable of providing a high-quality epitaxial silicon wafer with low LPD density and a vapor deposition apparatus for the same.

Means for Solving the Problem(s)

After dedicated studies, the inventors have noted a pressure change in the reaction chamber after the silicon wafer in the wafer-transfer chamber is transferred into the reaction chamber to arrive at the invention.

A manufacturing method of an epitaxial silicon wafer by forming an epitaxial film on a silicon wafer according to an aspect of the invention uses a vapor deposition apparatus including: a reaction chamber configured to grow the epitaxial film; a wafer-transfer chamber configured to receive the silicon wafer in a manner capable of transferring the silicon wafer to the reaction chamber through a communication portion configured to hermetically close or open the reaction chamber, and an exhaust device configured to exhaust the reaction chamber through an exhaust pipe connected to the reaction chamber, the method including: opening the communication portion while a pressure in the wafer-transfer chamber is higher than a pressure in the reaction chamber and the exhaust device exhausts the reaction chamber; transferring the silicon wafer received inside the wafer-transfer chamber to the reaction chamber; closing the communication portion; increasing the pressure in the reaction chamber over a pressure when the communication portion is closed and decreasing the pressure to displace a deposit present in the exhaust pipe toward the exhaust device; and starting a formation of the epitaxial film.

In the manufacturing method of an epitaxial silicon wafer according to the above aspect of the invention, it is preferable that the pressure in the reaction chamber is increased using an exhaust regulator provided in the exhaust pipe.

In the manufacturing method of an epitaxial silicon wafer according to the above aspect of the invention, it is preferable that the pressure in the reaction chamber is increased by regulating an exhaust of the reaction chamber using the exhaust regulator without changing a drive condition of the exhaust device after the communication portion is closed, and, subsequently, the deposit in the exhaust pipe is displaced toward the exhaust device using a difference between the pressure in the reaction chamber and a pressure in an area near the exhaust device with respect to the exhaust regulator, and the exhaust of the reaction chamber using the exhaust device.

In the manufacturing method of an epitaxial silicon wafer according to the above aspect of the invention, it is preferable that the exhaust regulator includes: a first regulator in a form of a hollow frustum including a first opening near the reaction chamber and a second opening near the exhaust device, the first opening being larger than the second opening; and a second regulator provided near the exhaust device with respect to the first regulator, the second regulator being in a form of a hollow frustum including a third opening near the reaction chamber and a fourth opening near the exhaust device, the third opening being larger than the fourth opening, in which, supposing that an inner diameter of the exhaust pipe, a diameter of the first opening and a diameter of the third opening are A, a diameter of the second opening is B and a diameter of the fourth opening is C, B/A and C/A are 0.33 or less, at least one of B/A and C/A is 0.26 or less, and (B+C)/A is 0.59 or less.

It should be noted that the "inner diameter of the exhaust pipe" herein means a diameter of an opening when the exhaust pipe is a cylindrical component, or an average of a maximum diameter and a minimum diameter of an opening when the exhaust pipe is a rectangular hollow. Similarly, the "diameter of each of the first to fourth openings" means, for instance, a diameter of each of openings when the first and second regulators are each a hollow truncated cone and the openings are circular, or an average of the maximum diameter and minimum diameter of each of openings when the first and second regulators are each a hollow truncated pyramid and the openings are polygonal.

A vapor deposition apparatus according to another aspect of the invention is configured to form an epitaxial film on a silicon wafer, the vapor deposition apparatus including: a reaction chamber configured to grow the epitaxial film; a wafer-transfer chamber configured to receive the silicon wafer in a manner capable of transferring the silicon wafer to the reaction chamber through a communication portion configured to hermetically close or open the reaction chamber; a transfer unit configured to transfer the silicon wafer received in the wafer-transfer chamber to the reaction chamber; an exhaust pipe connected to the reaction chamber and configured to exhaust the reaction chamber when the exhaust device is driven; and an exhaust regulator provided in the exhaust pipe and configured to regulate the exhaust of the reaction chamber, in which the exhaust regulator includes: a first regulator in a form of a hollow frustum including a first opening near the reaction chamber and a second opening near the exhaust device, the first opening being larger than the second opening; and a second regulator provided near the exhaust device with respect to the first regulator, the second regulator being in a form of a hollow frustum including a third opening near the reaction chamber and a fourth opening near the exhaust device, the third opening being larger than the fourth opening, and the first regulator and the second regulator are configured so that, supposing that an inner diameter of the exhaust pipe, a diameter of the first opening and a diameter of the third opening are A, a diameter of the second opening is B and a diameter of the fourth opening is C, B/A and C/A are 0.33 or less, at least one of B/A and C/A is 0.26 or less, and (B+C)/A is 0.59 or less.

According to the above aspect of the invention, a high-quality epitaxial silicon wafer with low LPD density can be obtained.

BRIEF DESCRIPTION OF DRAWING(S)

FIG. 2 is a schematic illustration of a part of the vapor deposition apparatus according to the exemplary embodiment.

FIG. 3 shows experimental results obtained by changing baffle shapes in Examples of the invention.

FIG. 4 is a graph showing a pressure change in a reaction chamber in Acceptable Experiments in Examples.

DESCRIPTION OF EMBODIMENT(S)

An exemplary embodiment of the invention will be described below with reference to the attached drawings.

Figure 1:
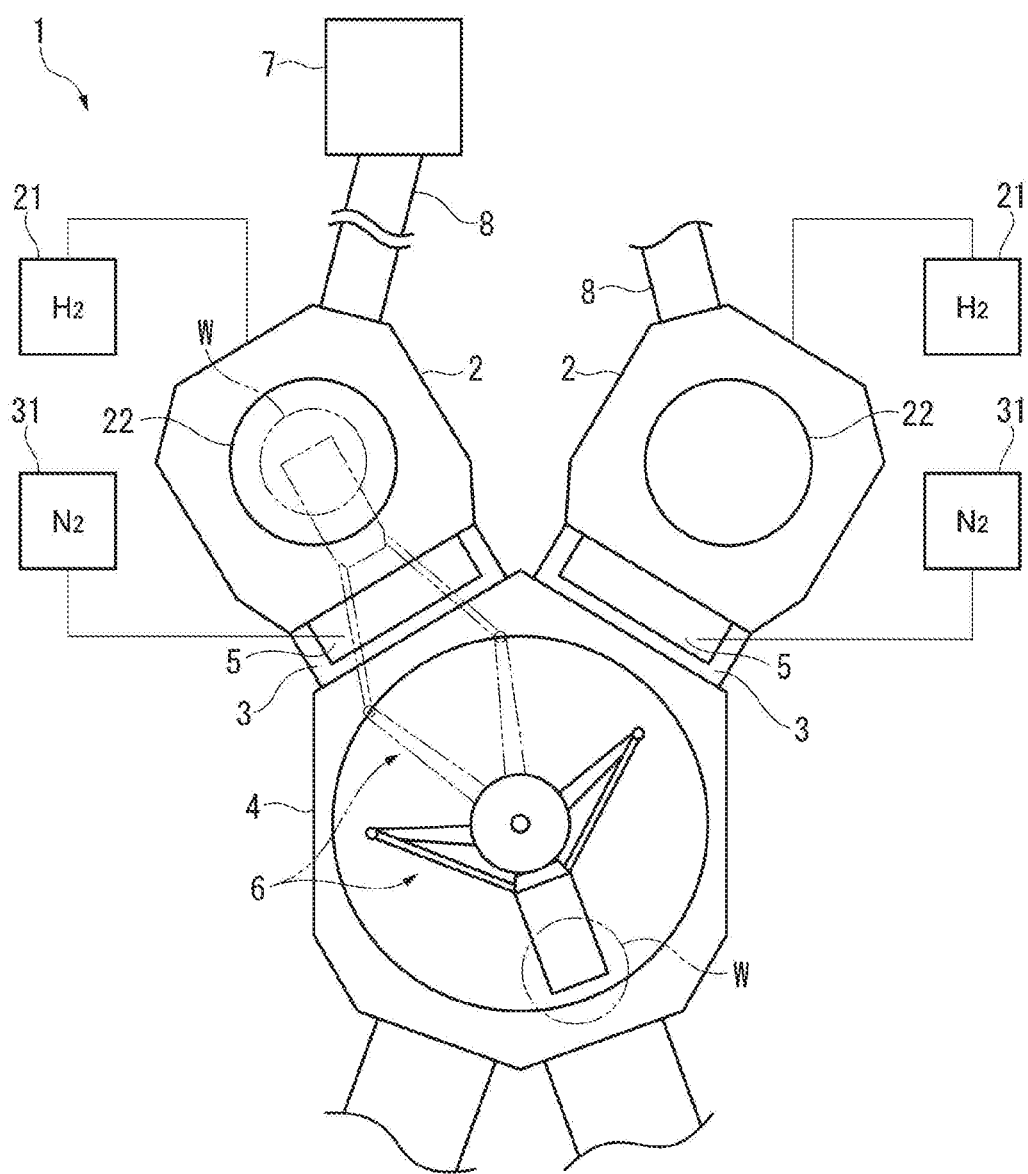
FIG. 1 is a schematic illustration of a vapor deposition apparatus according to an exemplary embodiment of the invention.

As shown in FIG. 1, a vapor deposition apparatus 1 includes a reaction chamber 2 in which an epitaxial film is grown, a communication portion 3, a wafer-transfer chamber 4 configured to receive a silicon wafer W in a manner capable of transferring the silicon wafer W to the reaction chamber 2 through the communication portion 3, an opening/closing portion 5 configured to hermetically close or open the communication portion 3, a transfer unit 6 configured to transfer the silicon wafer W received in the wafer-transfer chamber 4 to the reaction chamber 2, an exhaust device 7, and a cylindrical exhaust pipe 8 connected to the reaction chamber 2 and configured to exhaust the reaction chamber 2 when the exhaust device 7 is driven.

A hydrogen-gas feeder 21 configured to feed hydrogen gas ($H_2$) into the reaction chamber 2 is connected to the reaction chamber 2. A nitrogen-gas feeder 31 configured to feed nitrogen gas ($N_2$) into the wafer-transfer chamber 4 is connected to the communication portion 3.

When a silicon epitaxial film is grown on the silicon wafer W, the communication portion 3 is usually opened by the opening/closing portion 5 while the pressure inside the wafer-transfer chamber 4 is set higher than the pressure inside the reaction chamber 2 so as to keep the hydrogen gas inside the reaction chamber 2 from being flowed into the wafer-transfer chamber 4. Then, the transfer unit 6 places the silicon wafer W received in the wafer-transfer chamber 4 on a susceptor 22 provided in the reaction chamber 2.

The flow of the nitrogen gas present in the wafer-transfer chamber 4 into the reaction chamber 2 caused when the communication portion 3 is opened is stopped by closing the communication portion 3. When the pressure in the reaction chamber 2 reaches a predetermined level in the hydrogen gas atmosphere, the temperature in the reaction chamber 2 is increased to a predetermined temperature and a baking treatment is applied in the hydrogen gas atmosphere. Subsequently, a source gas such as trichlorosilane ($SiHCl_3$) is fed into the reaction chamber 2 through a carrier gas (hydrogen gas) and an epitaxial growth process is performed at a predetermined temperature and for a predetermined time. After the thickness of the epitaxial layer reaches a predetermined level, the supply of the source gas and the carrier gas is switched to only the supply of the carrier gas while the supply of the source gas is stopped.

After the epitaxial growth process is finished, the epitaxial silicon wafer placed on the susceptor 22 is transferred out of the apparatus, thereby producing the epitaxial silicon wafer.

When the communication portion 3 is opened in order to transfer the silicon wafer W received in the wafer-transfer chamber 4 into the reaction chamber 2, the gas in the reaction chamber 2 and the exhaust pipe 8 is displaced toward the exhaust device 7 due to an exhaust force caused by driving the exhaust device 7 (sometimes referred to as a "first exhaust force" hereinafter) and, in addition, a pressure difference (sometimes referred to as a "second exhaust force" hereinafter) between the wafer-transfer chamber 4 and the reaction chamber 2. When the communication portion 3 is closed, since the wafer-transfer chamber 4 is shut off from the reaction chamber 2, no second exhaust force is generated, where the gas in the reaction chamber 2 and the exhaust pipe 8 is displaced toward the exhaust device 7 only by the first exhaust force. In other words, the pressure in the reaction chamber 2 is immediately decreased without increasing after the communication portion 3 is closed. Accordingly, the effect for discharging a product present inside the exhaust pipe 8 toward the exhaust device 7 is weakened, so that the product becomes more likely to be flowed into the reaction chamber 2.

In contrast, when the pressure in the reaction chamber 2 is regulated so that, after the communication portion 3 is closed, the pressure is once increased over the pressure at the time when the communication portion 3 is closed, and then is decreased, a pressure difference is caused between the reaction chamber 2 and a location close to the exhaust device 7 with respect to the reaction chamber 2, the pressure difference (sometimes referred to as a "third exhaust force" hereinafter) and the first exhaust force displacing the gas in the reaction chamber 2 and the exhaust pipe 8 toward the exhaust device 7 at a flow rate faster than that occurred when the communication portion 3 is opened. The faster flow rate enables the product in the exhaust pipe 8 to be displaced to a location remote from the reaction chamber 2.

The pressure regulation of the reaction chamber 2 after the communication portion 3 is closed can be achieved by providing in the exhaust pipe 8 an exhaust regulator 9 configured to regulate the exhaust from the reaction chamber 2, as shown in FIG. 2. Specifically, the pressure regulation can be achieved by providing an upstream baffle 91 (first regulator) and a downstream baffle 92 (second regulator) in the exhaust pipe 8.

According to the above arrangement, the exhaust pipe 8 exemplarily include a first pipe 81, a second pipe 82 and a third pipe 83.

The upstream baffle 91, the downstream baffle 92, and the first to third pipes 81 to 83 are made from, for instance, a stainless steel having rigidity and acid resistance. The first pipe 81 and the third pipe 83 are cylindrical in shape. The second pipe 82 is a bellows-shaped extendable component. It should be noted that the second pipe 82 may be a cylindrical pipe.

The upstream baffle 91 is in a form of a hollow truncated cone having a first opening 91A near the reaction chamber 2, and a second opening 91B near the exhaust device 7, the first opening 91A having a larger diameter than that of the second opening 91B. An end of the upstream baffle 91 near the reaction chamber 2 is held between the first pipe 81 and the second pipe 82. The diameter of the first opening 91A is set to be equal to an inner diameter of the first pipe 81 and an inner diameter of the second pipe 82.

The downstream baffle 92 is provided near the exhaust device 7 with respect to the upstream baffle 91. The downstream baffle 92 is in a form of a hollow truncated cone having a third opening 92A near the reaction chamber 2 and a fourth opening 92B near the exhaust device 7, the third opening 92A having a larger diameter than that of the fourth opening 92B. An end of the downstream baffle 92 near the reaction chamber 2 is held between the second pipe 82 and the third pipe 83. The diameter of the third opening 92A is set to be equal to the inner diameter of the second pipe 82 and an inner diameter of the third pipe 83.

The above arrangement defines in the exhaust pipe 8 an upstream capture unit 93 and a downstream capture unit 94 each configured to capture the product flowed from the exhaust device 7. The upstream capture unit 93 is defined at a region between an outer circumferential surface of the upstream baffle 91 and an inner circumferential surface of the second pipe 82. The downstream capture unit 94 is defined at a region between an outer circumferential surface of the downstream baffle 92 and an inner circumferential surface of the third pipe 83.

Especially, it is preferable that the inner diameters (A) of the first to third pipes 81 to 83, the inner diameter (B) of the second opening 91B and the inner diameter (C) of the fourth opening 92B satisfy all of the requirements (1) to (3).

(1) B/A and C/A are 0.33 or less
(2) At least one of B/A and C/A is 0.26 or less
(3) (B+C)/A is 0.59 or less It should be noted that the shape of each of the upstream baffle 91 and the downstream baffle 92 is not specifically limited as long as all of the above requirements (1) to (3) are satisfied. The shape of each of the upstream baffle 91 and the downstream baffle 92 may alternatively be a hollow truncated cone or a hollow truncated pyramid. One of the upstream baffle 91 and the downstream baffle 92 may be a hollow truncated cone and the other of the upstream baffle 91 and the downstream baffle 92 may be a hollow truncated pyramid. Further, the first opening 91A of the upstream baffle 91 may be circular and the second opening 91B of the upstream baffle 91 may be polygonal. The third and fourth openings 92A, 92B of the downstream baffle 92 may also have different shapes.

The diameters of the second opening 91B and the fourth opening 92B are preferably 6 mm or more in order to restrain the second and fourth openings 91B and 92B from being clogged by the product. A height D of the upstream baffle 91 is preferably in a range from 45 mm to 69 mm. A height E of the downstream baffle 92 is preferably in a range from 25 mm to 37 mm.

A distance F from a lower end of the upstream baffle 91 to an upper end of the downstream baffle 92 is preferably in a range from 41 mm to 65 mm.

The first to third pipes 81 to 83 may each be a hollow cylinder or rectangular hollow.

As described above, in the exemplary embodiment, after the silicon wafer W in the wafer-transfer chamber 4 is transferred into the reaction chamber 2 and the communication portion 3 is closed, the pressure in the reaction chamber 2 is once increased and then decreased, thereby transferring the product present in the exhaust pipe 8 toward the exhaust device 7.

Accordingly, as compared to an instance in which the pressure in the reaction chamber 2 is decreased without being increased after the communication portion 3 is closed, the product can be displaced to a location remote from the reaction chamber 2, thereby restraining the product from flowing into the reaction chamber 2. Consequently, a high-quality epitaxial silicon wafer with low LPD density can be obtained.

Especially, since the exhaust regulator 9 is defined including the upstream baffle 91 and the downstream baffle 92, a high-quality epitaxial silicon wafer with low LPD density can be obtained with a simple process of forming each of the upstream and downstream baffles 91 and 92 into a predetermined shape.

Modification(s)

It should be noted that the scope of the invention is not limited to those disclosed in the above exemplary embodiment, but various improvements and modifications in design are possible as long as such improvements and modifications are compatible with the invention.

For instance, though the upstream baffle 91 and the downstream baffle 92 are held by the first to third pipes 81 to 83 in the exemplary embodiment, the upstream baffle 91 and the downstream baffle 92 may alternatively be received within the pipe(s) to be fixed, or may be formed integrally with the pipe(s).

The exhaust regulator 9 may be provided with, in place of the upstream baffle 91 and the downstream baffle 92, open/close units (e.g. valves) configured to open/close a flow path at the positions of the upstream baffle 91 and the downstream baffle 92. In the above arrangement, the open/close units may be configured to, approximately simultaneously with closing the communication portion 3, close the flow path in the exhaust pipe 8 to once increase the pressure in the reaction chamber 2, and then open the flow path in the exhaust pipe 8 to displace the product toward the exhaust device 7 by the gas flow having a flow rate faster than that of the gas flow when the communication portion 3 is opened.

In order to decrease the pressure in the reaction chamber 2 subsequently to once increasing the pressure after the communication portion 3 is closed, the drive status of the exhaust device 7 may be changed instead of providing the exhaust regulator 9.

EXAMPLES

Examples of the invention will be described below.

Initially, the upstream baffles 91 and downstream baffles 92 were prepared, where the inner diameter A of the first opening 91A, the inner diameter B of the second opening 91B, the inner diameter A of the third opening 92A, the inner diameter C of the fourth opening 92B, the height D, and the height E of the upstream baffles 91 and downstream baffles 92 were defined as shown in FIG. 3. The inner diameter A of the first to third pipes 81 to 83 of the exhaust pipe 8 was defined to be the same (31 mm) as the inner diameter A of the first opening 91A and the third opening 92A. Further, a 300-mm-diameter silicon wafer W was prepared.

Then, the upstream baffle 91 having the second opening 91B with the inner diameter B of 12 mm and the height D of 45 mm and the downstream baffle 92 having the fourth opening 92B with the inner diameter C of 12 mm and the height E of 25 mm were disposed in the exhaust pipe 8 of the vapor deposition apparatus 1 as shown in FIG. 1 and a plurality of epitaxial silicon wafers were manufactured under the following conditions (Experiment 1).

Initially, while the pressure in the wafer-transfer chamber 4 was set higher than the pressure in the reaction chamber 2, the communication portion 3 was opened to introduce the nitrogen gas present in the wafer-transfer chamber 4 into the reaction chamber 2. Subsequently, after transferring the silicon wafer W received in the wafer-transfer chamber 4 into the reaction chamber, a silicon epitaxial film was formed on the silicon wafer W while the communication portion 3 was closed and the supply of the nitrogen gas into the reaction chamber 2 was stopped. It should be noted that the drive conditions (exhaust conditions) of the exhaust device 7 were not changed from the time before the communication portion 3 was opened until the formation of the epitaxial film was finished. Further, the pressure in each of the reaction chamber 2 and the wafer-transfer chamber 4, the exhaust conditions of the exhaust device 7 and the like were set the same as manufacturing conditions of typical epitaxial silicon wafers as shown in Table 1 below. It should be noted that SLM (Standard Liter/Min) in Table 1 refers to a unit representing a flow rate in liter per minute at 1 atm ($1.013 \times 10^5$ Pa) and 0 degrees C.

TABLE 1

| When the communication portion is opened | Reaction chamber | Pressure in the reaction chamber | 101.7 kPa (763 Torr) |
|---|---|---|---|
| | | Exhaust pressure of exhaust device (constant before and after opening and closing the communication portion) | −0.22 kPa |
| | Wafer transfer chamber | Main hydrogen | 10 (SLM) |
| | | Reaction gas | 0 (SLM) |
| | | Purge nitrogen | 60 (SLM) |

Further, the upstream baffles 91 and downstream baffles 92 specified in FIG. 3 were provided as Experiments 2 to 24 and a plurality of epitaxial silicon wafers were manufactured in each of the Experiments 2 to 24 under the same conditions as those in Experiment 1. It should be noted that the downstream baffle 92 was not disposed in Experiments 11, 23 and the upstream baffle 91 was not disposed in Experiments 12, 24.

Next, the LPD of the epitaxial silicon wafers manufactured in Experiments 1 to 24 was evaluated according to the following conditions.

LPD Evaluation Conditions

Used machine: Surface inspection system (SP-2: manufactured by KLA Tencor Corporation)

Measurement target: LPD of 250 nm or more

The average number of LPDs per one epitaxial silicon wafer is shown in FIG. 3. The quality was evaluated as acceptable (OK) when the average number of LPDs is less than 0.1 and as unacceptable (NG) when the average number of LPDs is 0.1 or more. The results are shown in FIG. 3.

As shown in FIG. 3, it is found that Experiments 6, 8, 9, 10, 18, 20, 21, 22 (these Experiments sometimes collectively referred to as Acceptable Experiments hereinafter) have acceptable level of quality (i.e. high-quality). It is also found that Experiments 1 to 5, 7, 11 to 17, 19, 23, 24 (these Experiments sometimes collectively referred to as Unacceptable Experiments hereinafter) have unacceptable level of quality (i.e. not high-quality).

Based on the above results, it is found that, in order to obtain a high-quality epitaxial silicon wafer with low LPD density, the inner diameters (A) of the first to third pipes 81 to 83, the inner diameter B of the second opening 91B and the inner diameter C of the fourth opening 92B should satisfy all of the requirements (1) to (3) below.

(1) B/A and C/A are 0.33 or less
(2) At least one of B/A and C/A is 0.26 or less
(3) (B+C)/A is 0.59 or less In the above Experiments 1 to 24, a pressure change in the reaction chamber 2 after opening the communication portion 3 to introduce the nitrogen gas present in the wafer-transfer chamber 4 into the reaction chamber 2 and to transfer the silicon wafer W into the reaction chamber 2 and subsequently closing the communication portion 3 was measured using a pressure sensor.

Figure 5:
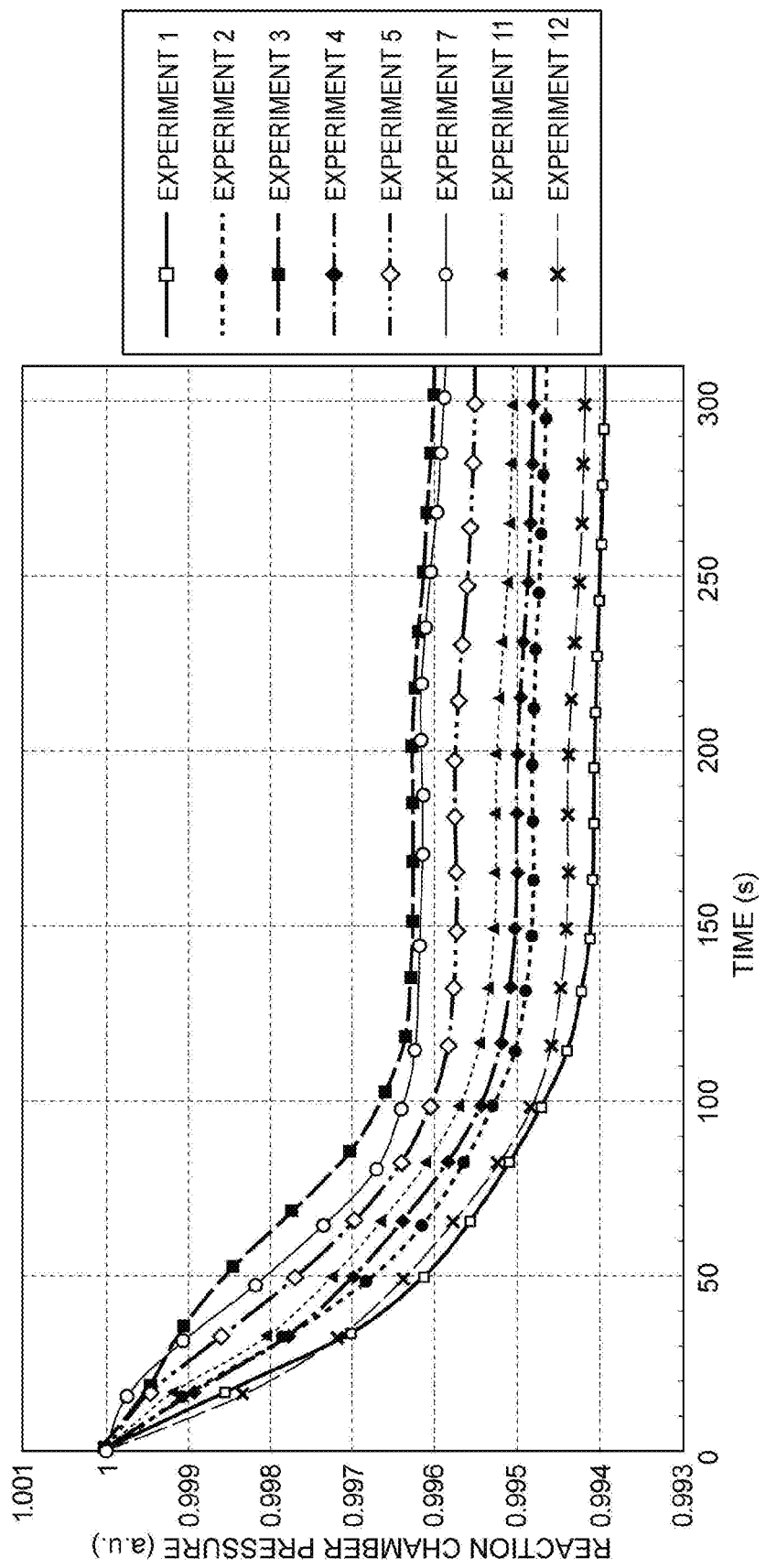
FIG. 5 is a graph showing a pressure change in the reaction chamber in Unacceptable Experiments in Examples.
Figure 6:
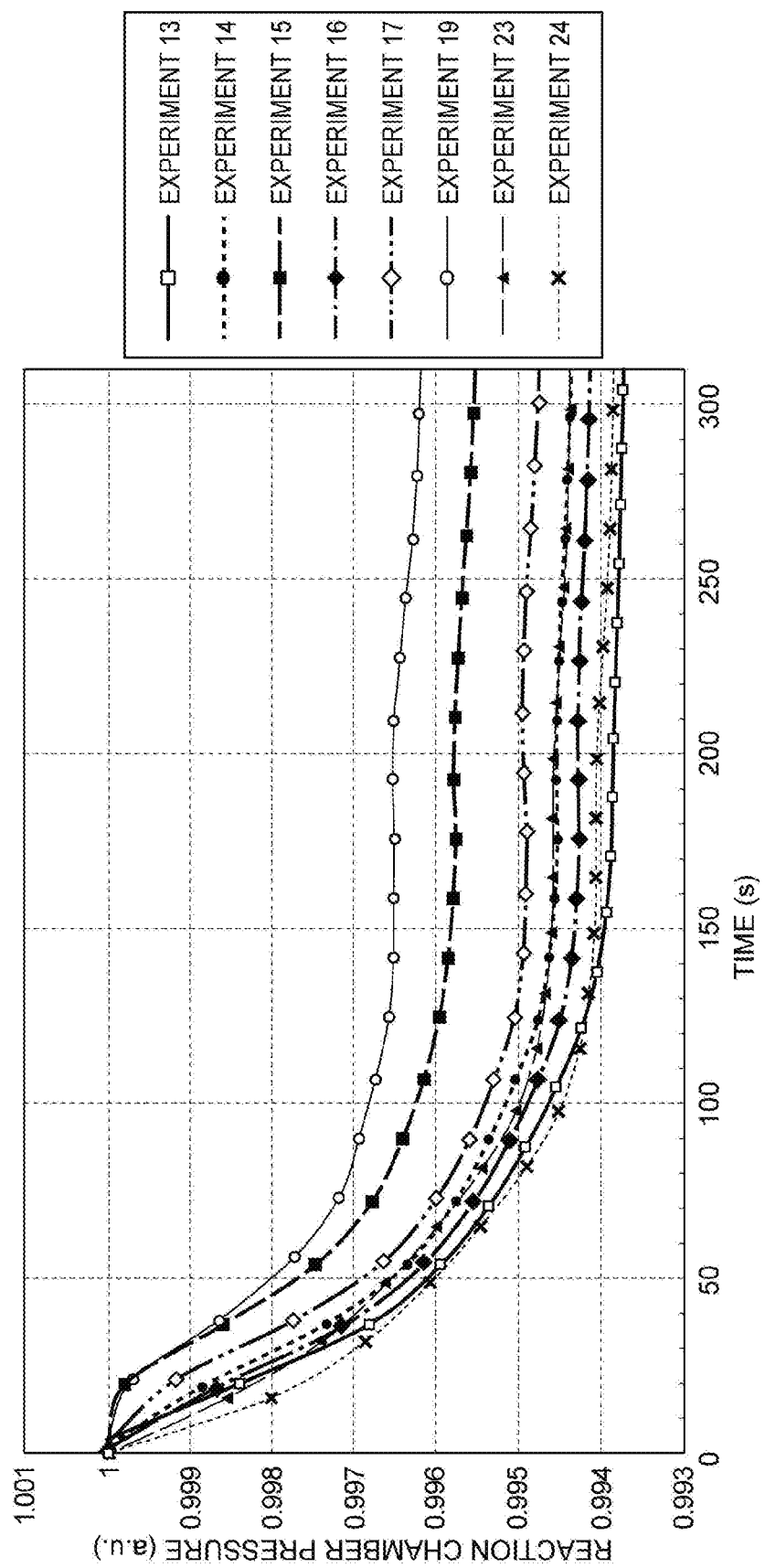
FIG. 6 is another graph showing a pressure change in the reaction chamber in Unacceptable Experiments in Examples.

The results of the Acceptable Experiments are shown in FIG. 4, and the results of the Unacceptable Experiments are shown in FIGS. 5 and 6.

It should be noted that the ordinate axes in FIGS. 4 to 6 represent a ratio of the pressure, where the pressure when the communication portion 3 is closed is defined as 1.

As shown in FIGS. 4 to 6, it is found that, in Acceptable Experiments, after the communication portion 3 is closed, the pressure in the reaction chamber 2 once increases over the pressure when the communication portion 3 is closed and subsequently decreases, whereas in Unacceptable Experiments, the pressure in the reaction chamber 2 immediately decreases without increasing after the communication portion 3 is closed. It should be noted that "Overshoot" in FIG. 3 means a phenomenon in which the pressure in the reaction chamber 2 once increases and subsequently decreases after the communication portion 3 is closed.

The invention claimed is:

1. A manufacturing method of an epitaxial silicon wafer by forming an epitaxial film on a silicon wafer using a vapor deposition apparatus, the vapor deposition apparatus comprising:
a reaction chamber configured to grow the epitaxial film;
a wafer-transfer chamber configured to receive the silicon wafer in a manner capable of transferring the silicon wafer to the reaction chamber through a communication portion configured to hermetically close or open the reaction chamber;

an exhaust device configured to exhaust the reaction chamber through an exhaust pipe connected to the reaction chamber: and an exhaust regulator provided in the exhaust pipe and configured to increase the pressure in the reaction chamber, the exhaust regulator comprising:

a first regulator in a form of a hollow frustum comprising a first opening near the reaction chamber and a second opening near the exhaust device, the first opening being larger than the second opening; and a second regulator provided near the exhaust device with respect to the first regulator, the second regulator being in a form of a hollow frustum comprising a third opening near the reaction chamber and a fourth opening near the exhaust device, the third opening being larger than the fourth opening, wherein an inner diameter of the exhaust pipe, a diameter of the first opening and a diameter of the third opening are A, a diameter of the second opening is B and a diameter of the fourth opening is C, B/A and C/A are 0.33 or less, at least one of B/A and C/A is 0.26 or less, and (B+C)/A is 0.59 or less, the method comprising:

opening the communication portion while a pressure in the wafer-transfer chamber is higher than a pressure in the reaction chamber and the exhaust device exhausts the reaction chamber;

subsequently transferring the silicon wafer received inside the wafer-transfer chamber to the reaction chamber;

subsequently closing the communication portion;

subsequently increasing the pressure in the reaction chamber over a pressure when the communication portion is closed and decreasing the pressure to displace a deposit present in the exhaust pipe toward the exhaust device; and subsequently starting a formation of the epitaxial film.

2. The manufacturing method of an epitaxial silicon wafer according to claim 1, wherein the pressure in the reaction chamber is increased by regulating an exhaust of the reaction chamber using the exhaust regulator without changing a drive condition of the exhaust device after the communication portion is closed, and subsequently, the deposit in the exhaust pipe is displaced toward the exhaust device using a difference between the pressure in the reaction chamber and a pressure in an area near the exhaust device with respect to the exhaust regulator, and the exhaust of the reaction chamber using the exhaust device.

3. A vapor deposition apparatus configured to form an epitaxial film on a silicon wafer, comprising:

a reaction chamber configured to grow the epitaxial film;

a wafer-transfer chamber configured to receive the silicon wafer in a manner capable of transferring the silicon wafer to the reaction chamber through a communication portion configured to hermetically close or open the reaction chamber;

a transfer unit configured to transfer the silicon wafer received in the wafer-transfer chamber to the reaction chamber;

an exhaust pipe connected to the reaction chamber and configured to exhaust the reaction chamber when the exhaust device is driven; and an exhaust regulator provided in the exhaust pipe and configured to regulate the exhaust of the reaction chamber, wherein the exhaust regulator comprises:

a first regulator in a form of a hollow frustum comprising a first opening near the reaction chamber and a second opening near the exhaust device, the first opening being larger than the second opening; and a second regulator provided near the exhaust device with respect to the first regulator, the second regulator being in a form of a hollow frustum comprising a third opening near the reaction chamber and a fourth opening near the exhaust device, the third opening being larger than the fourth opening, and wherein the first regulator and the second regulator are configured so that, where an inner diameter of the exhaust pipe, a diameter of the first opening and a diameter of the third opening are A, a diameter of the second opening is B and a diameter of the fourth opening is C, B/A and C/A are 0.33 or less, at least one of B/A and C/A is 0.26 or less, and (B+C)/A is 0.59 or less.

* * * * *